United States Patent
Guerrero Mercado

(10) Patent No.: US 6,750,685 B1
(45) Date of Patent: Jun. 15, 2004

(54) APPARATUS AND METHOD FOR A BI-DIRECTIONAL CHARGE DRIVER CIRCUIT

(75) Inventor: Francisco Javier Guerrero Mercado, Landsberg am Lech (DE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/155,263

(22) Filed: May 23, 2002

(51) Int. Cl.[7] .................................................. H03B 1/00
(52) U.S. Cl. ..................... 327/108; 327/111; 327/112
(58) Field of Search .................. 327/108, 111, 327/112, 148, 157, 536, 142, 198, 541, 543, 544, 170, 172, 175, 176, 374, 376, 377, 307, 109, 390; 326/83, 17, 88; 323/285, 223, 225, 315; 363/59, 60, 62; 341/147, 150

(56) References Cited

U.S. PATENT DOCUMENTS 4,527,081 A * 7/1985 Stewart ........................ 326/17
5,672,990 A * 9/1997 Chaw .......................... 327/176
6,111,469 A * 8/2000 Adachi ......................... 331/17
6,160,432 A * 12/2000 Rhee et al. .................. 327/157

OTHER PUBLICATIONS

Roubik Gregorian et al., "Introduction", *The Use of Analog MOS Integrated Circuits For Signal Processing*, Ch. 1, pp. 4, Figure 1.3, (1986).

* cited by examiner

Primary Examiner—Long Nguyen
(74) Attorney, Agent, or Firm—Merchant & Gould P.C.; Joshua W. Korver

(57) ABSTRACT

A bi-directional charge driver circuit provides an output voltage that may be increased or decreased according to two control signals. When the output voltage is configured as an adjustable reference voltage, the adjustable reference voltage may be varied in selectable increments to obtain a desired reference voltage. Alternatively, when the bi-directional charge driver circuit is configured as a digital-to-analog converter, the two control signals are given by a logic circuit in response to two digital input signals. The two digital input signals are converted by the bi-directional charge driver circuit to the analog output voltage.

19 Claims, 5 Drawing Sheets

(PULSE GENERATOR)

APPARATUS AND METHOD FOR A BI-DIRECTIONAL CHARGE DRIVER CIRCUIT

FIELD OF THE INVENTION

The present invention relates to the field of charge driver circuits, and in particular, to a bi-directional charge driver circuit.

BACKGROUND OF THE INVENTION

Various circuits utilize switches in combination with a capacitor. For example, certain switch capacitor circuits are used to provide adjustment circuitry for timing signals, where the charge on the capacitor affects the period, pulse width, delay, or other aspect of the timing signals. Other applications for switch capacitors include regulation circuitry that utilizes the capacitor as a capacitive load to regulate an output signal to a desired level.

SUMMARY OF THE INVENTION

The present invention is directed to a bi-directional charge driver circuit that is operable to increase or decrease the charge on a capacitance circuit. The bi-directional charge driver circuit arranged to sink and source current to the capacitance circuit in response to two control signals. The capacitance circuit provides an output voltage that corresponds to the charge stored on the capacitance circuit. In one embodiment, the output voltage corresponds to an adjustable voltage reference that may be increased or decreased as required. In another embodiment, the two control signals are produced according to a logic circuit in response to two digital input signals. In this embodiment, the bi-directional charge driver circuit operates as a digital-to-analog converter, converting the two digital input signals to an analog output voltage. In yet another embodiment, one of the digital input signals is a pulse signal produced by a pulse generator circuit, wherein the pulse signal has an associated pulse width that affects the amount the capacitance circuit is charged and discharged.

Briefly stated, a bi-directional charge driver circuit provides an output voltage that may be increased or decreased according to two control signals. When the output voltage is configured as an adjustable reference voltage, the adjustable reference voltage may be varied in selectable increments to obtain a desired reference voltage. Alternatively, when the bi-directional charge driver circuit is configured as a digital-to-analog converter, the two control signals are given by a logic circuit in response to two digital input signals. The two digital input signals are converted by the bi-directional charge driver circuit to the analog output voltage.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention generates an adjustable voltage from a control signal. A bi-directional charge driver circuit includes two control signals, a control signal and a second control signal. Current is sourced to a node by a portion of the bi-directional charge driver circuit that corresponds to the first control signal when actuated by the first control signal. The capacitance circuit is charged in response to the current sourced to the node, resulting in an increase of the voltage at the node. Similarly, current is sunk from the node by the portion of the bi-directional charge driver circuit corresponding to the second control signal when actuated by the second control signal. The capacitance circuit is discharged in response to the current sunk from the node, resulting in a decrease of the voltage at the node.

Figure 1:
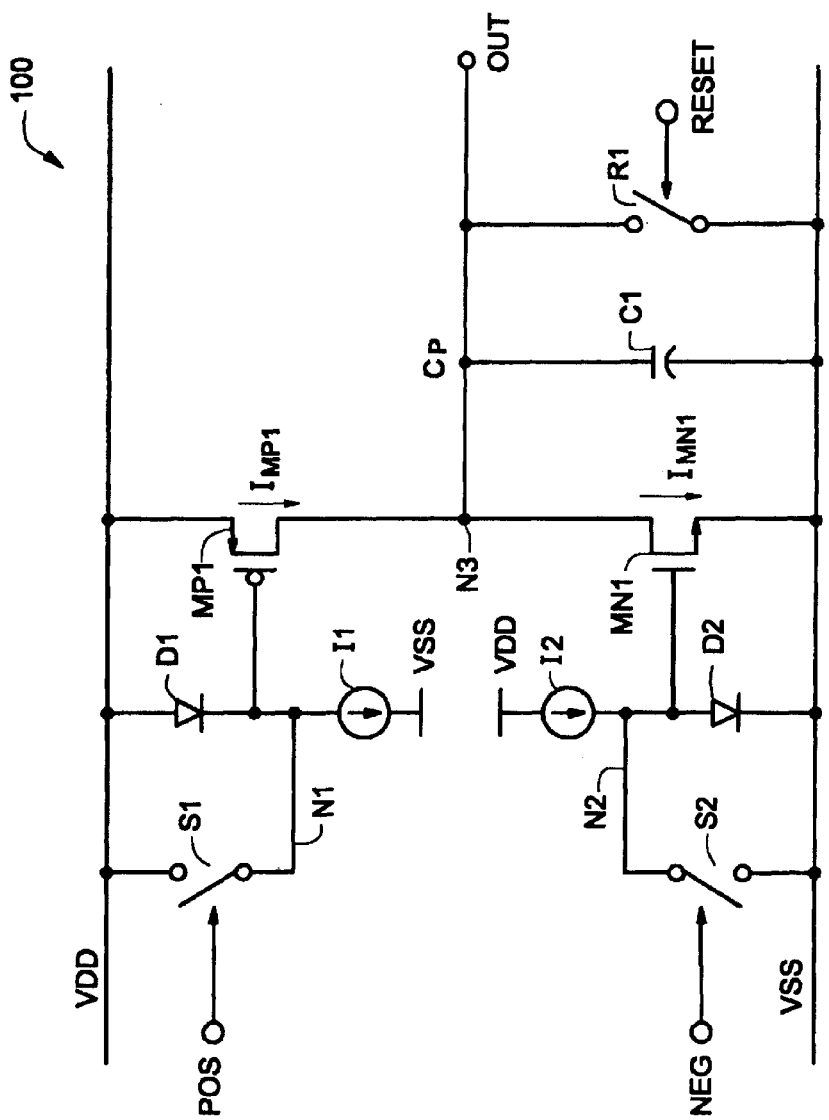
FIG. 1 illustrates an exemplary embodiment of a bi-directional charge driver circuit.

FIG. 1 illustrates an exemplary embodiment of a bi-directional charge driver circuit. The bi-directional charge driver circuit (100) includes two switch circuits (S1, S2), two diode circuits (D1, D2), two current sources (I1, I2), two MOS transistors (MP1, MN1), a capacitor (C1), and a reset circuit (R1).

Switch circuit S1 is coupled between the upper voltage supply (VDD) and node N1. Switch circuit S2 is coupled between the lower voltage supply (VSS) and node N2. Diode circuit D1 is coupled between VDD and node N1. Diode circuit D2 is coupled between node N2 and VSS. Current source I1 is coupled between node N1 and VSS. Current source I2 is coupled between VDD and node N2. MOS transistor MP1 includes a source that is coupled to VDD, a drain that is coupled to node N3, and a gate that is coupled to node N1. MOS transistor MN1 includes a source that is coupled to VSS, a drain that is coupled to node N3, and a gate that is coupled to node N2. Capacitance circuit C1 is coupled between node N3 and VSS. Reset circuit R1 is coupled in parallel to capacitance circuit C1, between node N3 and VSS. Node N3 corresponds to the reference node and output (OUT) for bi-directional charge driver circuit 100.

In operation, switch circuit S1 is actuated by a control signal POS, and switch circuit S2 is actuated by a control signal NEG. In one embodiment, control signals POS and NEG are digital signals. Accordingly, control signal POS is a high logic level (e.g., logic "1") during an interval of time and is a low logic level (e.g., logic "0") during another interval of time. In addition, control signal NEG is a high logic level (e.g., logic "1") during an interval of time and is a low logic level (e.g., logic "0") during another interval of time. Choosing the logic levels of both signals (POS, NEG) allows the state of the bi-directional charge driver circuit (100) to be selected. In one embodiment, the bi-directional charge driver circuit (100) has three states of operation depending on the logic levels of both control signals (POS, NEG): steady state; charge state; and discharge state.

Steady State

At steady state, control signal POS and control signal NEG are selected such that switch circuit S1 and switch circuit S2 are both closed. With switch circuit S1 closed, current is pulled by current source I1 through switch circuit S1. The voltage at node N1 approximately corresponds to VDD while switch circuit S1 is in a closed position. MOS transistor MP1 and diode circuit D1 are deactivated in response to the voltage level at node N1. Accordingly, no current flows through MOS transistor MP1 to node N3 since MOS transistor MP1 is deactivated.

With switch circuit S2 closed, current from current source I2 is pulled through switch circuit S2. The voltage at node N2 approximately corresponds to VSS while switch circuit S2 is in the closed position. MOS transistor MN1 and diode circuit D2 are deactivated in response to the voltage level at node N2. Accordingly, no current flows through MOS transistor MN1 from node N3 since MOS transistor MN1 is deactivated.

The voltage (Cp) at node N3 is held constant when both MOS transistors (MP1, MN1) are deactivated and node N3 is unloaded. The charge stored by capacitance circuit C1 is therefore also held constant when MOS transistors MP1 and MN1 are deactivated.

During steady state, reset circuit R1 may be actuated in response to a reset signal (Reset). The charge on capacitance circuit C1 discharges to a voltage corresponding to the lower voltage supply (VSS) in response to the closing of the switch representing reset circuit R1. In one embodiment, the Reset signal actuates reset circuit R1 at power-up of the bi-directional charge driver circuit (100) to remove any residual charge that is stored on capacitance circuit C1. In another embodiment, charge stored on capacitance circuit C1 is adjusted to a predetermined voltage level in response to the closing of the switch representing reset circuit R1.

In another embodiment, capacitance circuit C1 experiences leakage during steady state resulting in the charge on capacitance circuit C1 drifting from a constant level. For example, leakage currents of transistors MP1, MN1, or transistors of reset circuit R1 may result in draining charge from capacitance circuit C1. In one embodiment, the transistors are a minimum size such that leakage is also minimized.

Charge State

For the charge state, switch circuit S1 is in an open position in response to control signal POS, and switch circuit S2 is in a closed position in response to control signal NEG. Similar to steady state, MOS transistor MN1 is deactivated while switch circuit S2 is in a closed position. Diode circuit D1 is forward biased by current source I1 when switch circuit S1 is in an open position. The current through diode circuit D1 is mirrored through MOS transistor MP1. The current ($I_{MP1}$) through MOS transistor MP1 is dependent on the mirror ratio between diode circuit D1 and MOS transistor MP1. The charge stored on capacitance circuit C1 increases in response to the current ($I_{MP1}$) that is provided by MOS transistor MP1 to node N3. The potential at node N3 increases in response to the increased charge of capacitance circuit C1. The output signal (OUT) has an increased voltage (Cp) in response to the increase of the potential at the node N3.

Discharge State

For the discharge state, switch circuit S1 is in a closed position in response to control signal POS and switch circuit S2 is open in response to control signal NEG. Similar to steady state, MOS transistor MP1 is deactivated when switch circuit S1 is in a closed position. Diode circuit D2 is forward biased by current source I2 when switch circuit S2 is in an open position. The current through diode circuit D2 is mirrored through MOS transistor MN1. The charge on capacitance circuit C1 decreases in response to the current ($I_{MN1}$) that is pulled through MOS transistor MN1 from node N3. The potential at node N3 decreases in response to the decreased charge stored in capacitance circuit C1. The output signal (OUT) has a decreased voltage (Cp) in response to the decrease of the potential at node N3.

The bi-directional charge driver circuit (100) operates to adjust a voltage in both the positive and negative direction according to control signals POS and NEG. In one embodiment, the bi-directional charge driver circuit (100) is utilized as a digital-to-analog converter (DAC). The digital control signals (POS, NEG) are converted to an analog signal at output terminal OUT. As a DAC, the bi-directional charge driver circuit (100) includes the ability to count bi-directionally without clearing the previous charge level on capacitance circuit C1. The charge on capacitance circuit C1 may be increased or decreased immediately in response to digital control signals POS and NEG. It is appreciated that a certain amount of temperature coefficient may exist since the bi-directional charge driver circuit (100) shown does not include circuitry to compensate for the early effect on MOS transistors MP1 and MN1. However, circuitry may be included to compensate for non-ideal properties.

In one embodiment, the current received or drained from node N3 may be increased or decreased in order to adjust the rate at which capacitance circuit C1 is charged and discharged. For example, the current sources (I1, I2) may be adjusted to mirror a higher or lower current through MOS transistors MP1 and MN1. The increased or decreased current through MP1 and MN1 changes the incremental amount that capacitance circuit C1 is charged or discharged. In a further example, the current charging the capacitance circuit may be increased to bring the voltage (Cp) to a predetermined level. Once the predetermined level is reached, the current utilized to charge and discharge capacitance circuit C1 is decreased to implement fine correction of the voltage (Cp).

In one embodiment, the voltage produced by bi-directional charge driver circuit 100 is utilized as an adjustable reference voltage. A buffer circuit (not shown) may be included at the output terminal (OUT). The voltage produced by the buffer circuit may be utilized as a reference voltage for subsequent circuitry (not shown). Also, an appropriate feedback circuit may be included that provides signals POS and NEG such that the reference voltage may be adjusted according to the feedback. In another embodiment, the voltage (Cp) is utilized to compensate for an error in another voltage, such as the offset voltage at the input of an operational amplifier.

Figure 2:
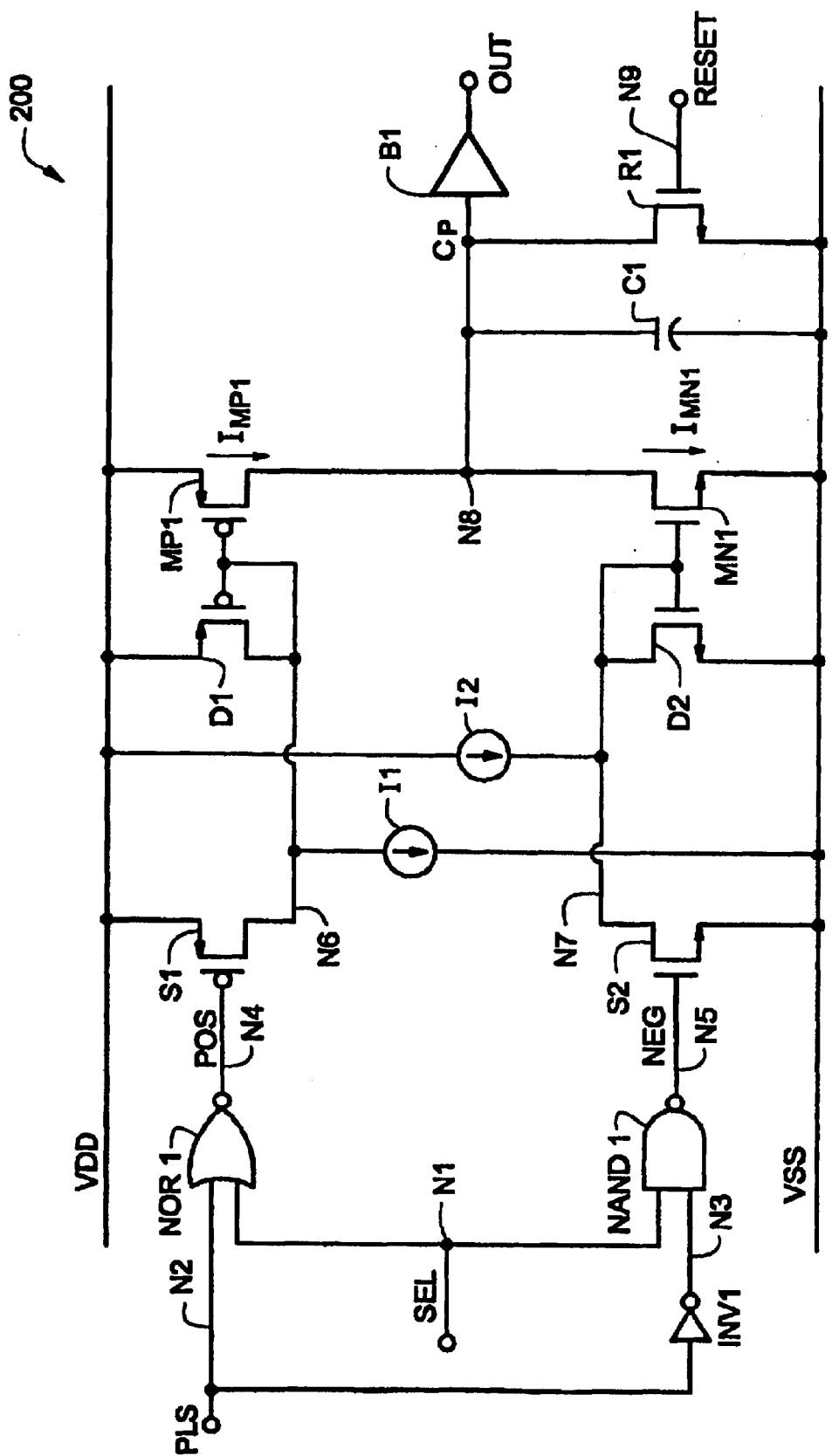
FIG. 2 shows another exemplary embodiment of a bi-directional charge driver circuit.

FIG. 2 shows another exemplary embodiment of a bi-directional charge driver circuit. The bi-directional charge driver circuit (200) includes two logic circuits (NOR1, NAND1), an inverter circuit (INV1), seven MOS transistors (S1, S2, D1, D2, MP1, MN1, R1), two current sources (I1, I2), an a capacitance circuit (C1), and buffer circuit (B1).

Logic circuit NOR1 includes a first input that is coupled to node N1, a second input that is coupled to node N2, and an output that is coupled to node N4. Logic circuit NAND1 includes a first input that is coupled to node N1, a second input that is coupled to node N3, and an output that is coupled to node N5. Inverter circuit INV1 is coupled between node N2 and node N3. MOS transistor S1 includes a source that is coupled to the upper voltage supply (VDD), a drain that is coupled to node N6, and a gate that is coupled to node N4. MOS transistor S2 includes a source that is coupled to the lower voltage supply (VSS), a drain that is coupled to node N7, and a gate that is coupled to node N5. MOS transistor D1 includes a source that is coupled to VDD, and a gate and drain that are coupled to node N6. MOS transistor D2 includes a source that is coupled to VSS, and a gate and drain that are coupled to node N7. MOS transistor MP1 includes a source that is coupled to VDD, a drain that is coupled to node N8, and a gate that is coupled to node N6. MOS transistor MN1 includes a source that is coupled to VSS, a drain that is coupled to node N8, and a gate that is coupled to node N7. MOS transistor R1 includes a source that is coupled to VSS, a drain that is coupled to node N8, and a gate that is coupled to node N9. Current source I1 is coupled between node N6 and VSS. Current source I2 is coupled between VDD and node N7. Capacitance circuit C1 is coupled between node N8 and VSS. Node N8 corresponds to the reference node and is coupled to buffer circuit B1 that provides the output (OUT) for bi-directional charge driver circuit 200.

The bi-directional charge driver circuit (200) of FIG. 2 operates similar to the bi-directional charge driver circuit (100) of FIG. 1. The bi-directional charge driver circuit (200) illustrates the switch circuits (S1, S2), the diode circuits (D1, D2), and the reset circuit (R1) implemented as MOS transistors (S1, S2, D1, D2, R1) respectively. MOS transistors S1 and S2 operate similarly to the switch circuits (S1, S2) shown in FIG. 1. MOS transistors S1 and S2 correspond to switch circuits S1 and S2 shown in FIG. 1 being "opened" when MOS transistors S1 and S2 are deactivated. MOS transistors S1 and S2 correspond to switch circuits S1 and S2 shown in FIG. 1 being "closed" when MOS transistors S1 and S2 are activated. MOS transistor S1 is activated when control signal POS is a low logic level and deactivated when control signal POS is a high logic level. In contrast, MOS transistor S2 is activated when control signal NEG is a high logic level and deactivated when control signal NEG is a low logic level. The states (i.e., steady state, charge state, and discharge state) described in connection with FIG. 1 are achieved according to the relationship of control signals POS and NEG described in the following table (Table 1): ("1" denotes a high logic level and "0" denotes a low logic level)

TABLE 1

|  | POS | NEG |
|---|---|---|
| steady state | 0 | 1 |
| charge state | 1 | 1 |
| discharge state | 0 | 0 |

Circuitry (NOR1, NAND1, INV1) for generating control signals POS and NEG from a pulse signal (PLS) and a select signal (SEL) is included in the bi-directional charge driver circuit (200) shown in FIG. 2. In one embodiment, the pulse signal (PLS) corresponds to a signal generated by a pulse generator in response to a clock signal (See FIG. 3). The following table (Table 2) illustrates the relationship between pulse signal PLS, select signal SEL, and control signals POS and NEG according to the logic of FIG. 2: ("1" denotes a high logic level and "0" denotes a low logic level)

TABLE 2

| PLS | SEL | POS | NEG |
|---|---|---|---|
| 0 | 0 | 1 | 1 |
| 0 | 1 | 0 | 0 |
| 1 | 0 | 0 | 1 |
| 1 | 1 | 0 | 1 |

Reexamining table 1 in light of table 2 results in the following table (Table 3) for the states (i.e., steady state, charge state, and discharge state) described above in terms of the pulse signal PLS and select signal SEL: ("1" denotes a high logic level and "0" denotes a low logic level)

TABLE 3

| PLS | SEL | State |
|---|---|---|
| 0 | 0 | charge state |
| 0 | 1 | discharge state |
| 1 | 0 | steady state |
| 1 | 1 | steady state |

Examining table 3, the combination of pulse signal PLS and select signal SEL results in the bi-directional charge driver circuit (200) entering steady state, charge state, or discharge state. Using the logic circuitry (NOR1, NAND1) shown in FIG. 2 avoids the state where both MOS transistor S1 and S2 are open causing the adjustable voltage reference circuit (200) to attempt to charge and discharge capacitance circuit C1 simultaneously. In addition, depending on the logic level of the select signal (SEL), the bi-directional charge driver circuit (200) charges or discharges capacitance circuit C1 in response to a low logic level pulse provided by pulse signal PLS.

In one embodiment, the voltage produced by bi-directional charge driver circuit 200 is utilized as an adjustable reference voltage. A buffer circuit (B1) is included at the output terminal (OUT). The voltage produced by the buffer circuit may be utilized as reference voltage for subsequent circuitry. Also, an appropriate feedback circuit may be included that provides select signal (SEL) such that the reference voltage may be adjusted according to the feedback. In another embodiment, the voltage (Cp) is utilized to compensate for an error in another voltage, such as the offset voltage at the input of an operational amplifier.

Figure 3:
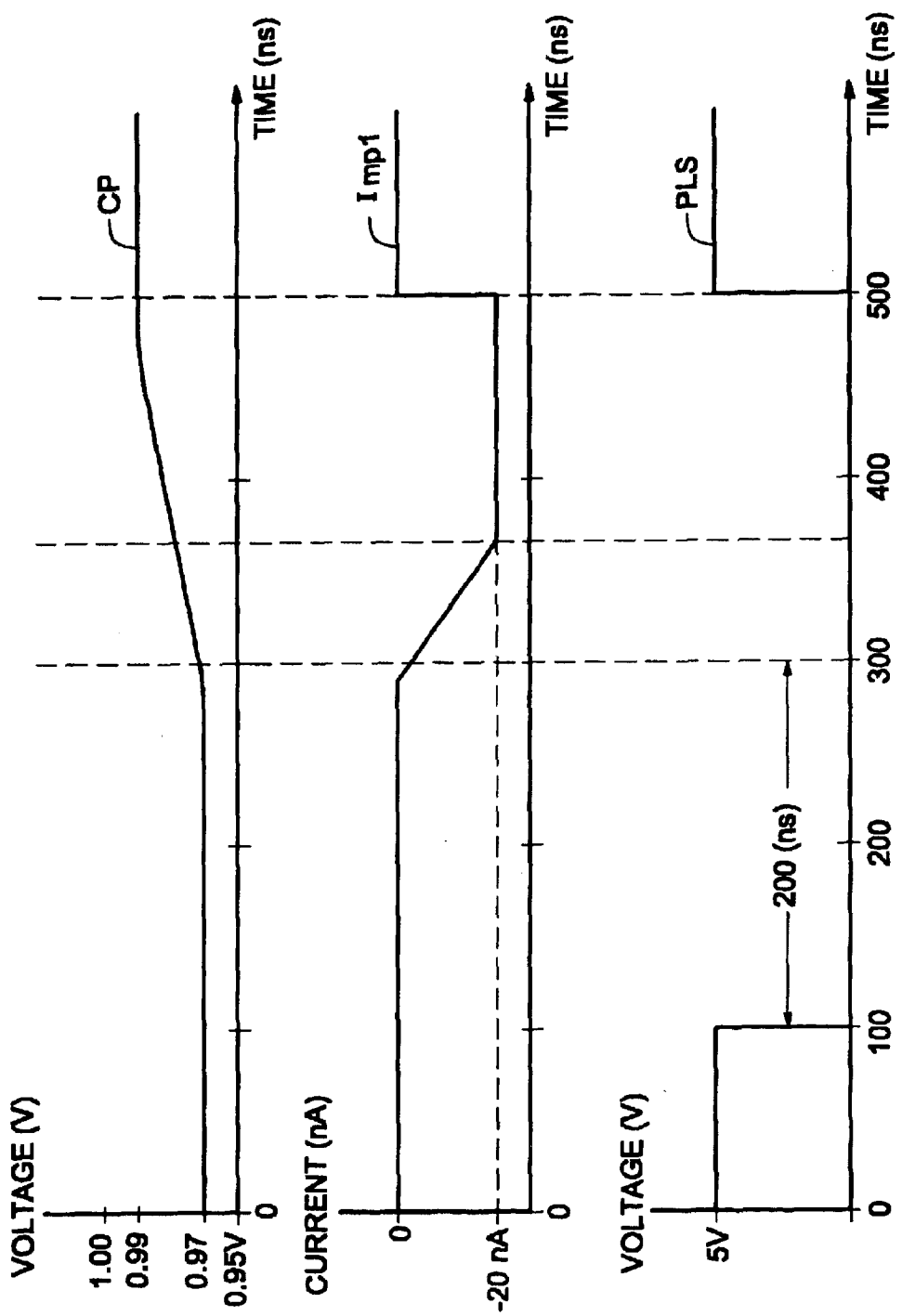
FIG. 3 illustrates an exemplary timing diagram for the bi-directional charge driver circuit shown in FIG. 2.

FIG. 3 illustrates an exemplary timing diagram for the bi-directional charge driver circuit (200) of FIG. 2. The timing diagram (300) includes the voltage (Cp) at the output terminal (OUT) of bi-directional charge driver circuit 200, the current ($I_{MP1}$) through MOS transistor MP1, and the pulse signal (PLS) received at node N1.

When the pulse signal (PLS) transitions from a high logic level (5V) to a low logic level (0V) and the select signal (SEL) is a low logic level, the transition of pulse signal (PLS) is followed by an increase in the amplitude of current ($I_{MP1}$) through MOS transistor MP1. The current through ($I_{MP1}$) is shown as having a negative amplitude to show the direction of current flow with respect to the drain of MOS transistor MP1. An exemplary delay of 200 ns is illustrated between the time the pulse signal (PLS) transitions to a low logic level (at 100 ns) and the time the amplitude of current IMP1 begins to increase (at 300 ns). The exemplary delay is due to the time delay to charge the gate of diode-connected MOS transistor D1, such that current flows through MOS transistor D1 and is mirrored to MOS transistor MP1. During the interval of time (300 ns –500 ns) where the current ($I_{MP1}$) through MOS transistor MP1 increases to its biased level (e.g., –20 nA), and the voltage (Cp) corresponding to node N3 increases (e.g., from 0.97 V to 0.99 V). When the pulse signal transitions back to a high logic level, the current ($I_{MP1}$) through MOS transistor MP1 is cutoff and the voltage (Cp) is held constant at the newly established level (e.g., 0.99 V).

Figure 4:
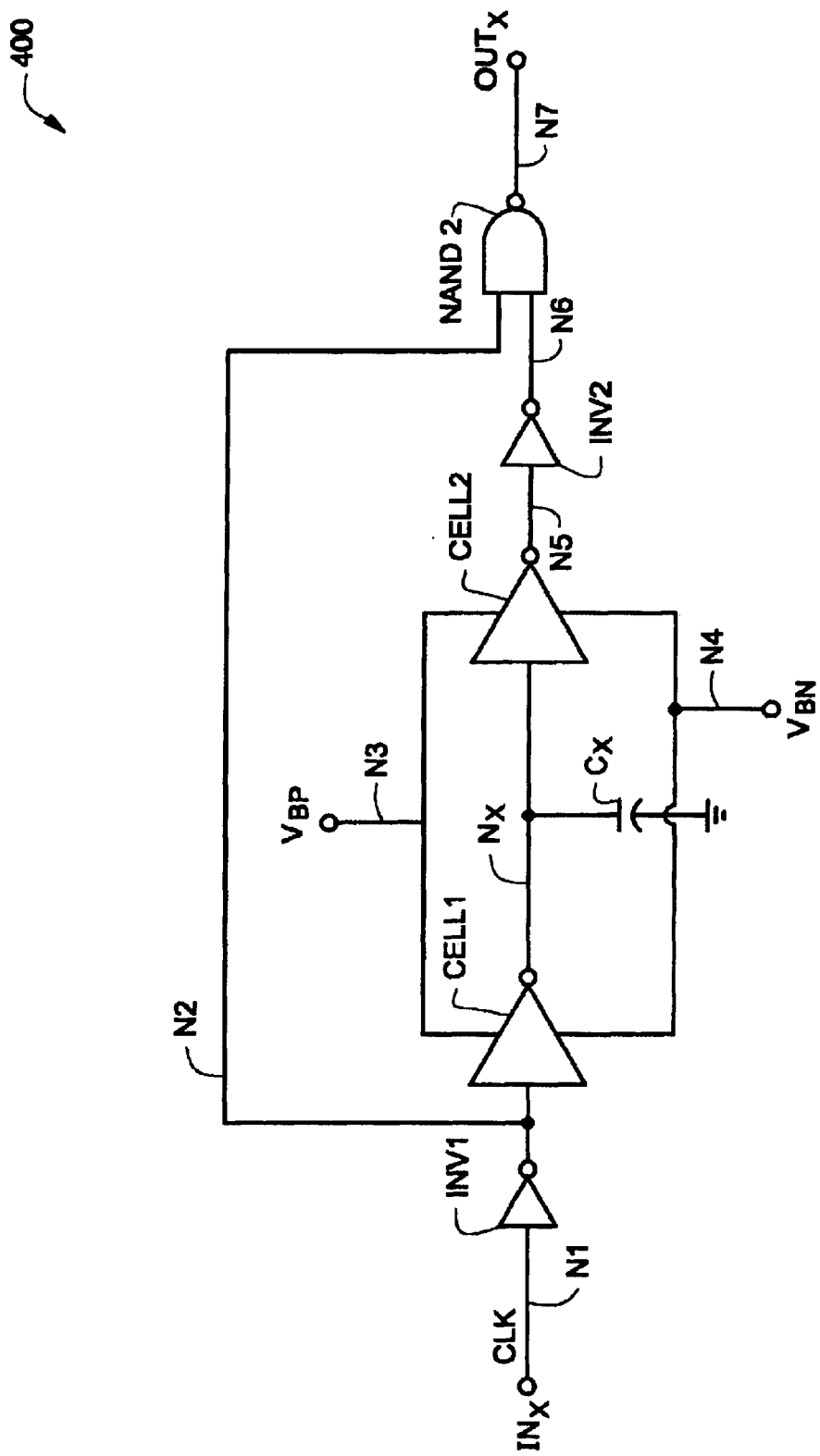
FIG. 4 illustrates an exemplary pulse generator circuit for use with a bi-directional charge driver circuit.

FIG. 4 illustrates an exemplary pulse generator circuit for use with a bi-directional charge driver circuit. The pulse generator circuit (400) includes two inverter circuits (INV1, INV2), two current-limited inverter circuits (CELL1, CELL2), and a logic circuit (NAND2).

Inverter circuit INV1 is coupled between node N1 and node N2. Inverter circuit INV2 is coupled between node N5 and N6. Current-limited inverter circuit CELL 1 includes a first input that is coupled to node N2, a second input that is coupled to node N3, a third input that is coupled to node N4, and an output that is coupled to node Nx. Current-limited inverter circuit, CELL 2 includes a first input that is coupled to node Nx, a second input that is coupled to node N3, a third input that is coupled to node N4, and an output that is coupled to node N5. Logic circuit NAND2 includes a firs input that is coupled to node N6, a second input that is coupled to node N2, and an output that is coupled to node N7. Node N7 corresponds to the output of pulse generator circuit 400.

In one example, a rising edge of a clock signal CLK is received at input terminal INx. The output of inverter circuit INV1 transitions to a low logic level at node N2 in response to the rising edge of clock signal CLK. The output of current-limited inverter circuit CELL 1 transitions to a high logic level at node Nx in response to the transition to a low logic level at node N2. The slew rate of the transition for current-limited inverter circuit CELL 1 is established by bias currents VBN and VBP as described in greater detail with FIG. 5. The charge time of capacitance circuit Cx is dependent on the slew rate of the transition for current-limited inverter circuit CELL 1 and the size of capacitance circuit Cx. As the charge of capacitance circuit Cx increases the potential at node Nx increases. The output of current-limited inverter circuit CELL 2 transitions to a low logic level at node N5 when the potential at node Nx reaches a specified threshold. The output of inverter circuit INV2 transitions to a high logic level at node N6 in response to the transition to a low logic level at node N5. The signal at node N6 is combined with the signal at node N2 to produce a pulse signal at output terminal OUTx. The width of the pulse signal at output terminal OUTx is defined by the charge and discharge time of capacitance circuit Cx as affected by the slew rates of the transitions for current-limited inverter circuit CELL 1.

In another embodiment, a resistive circuit (not shown) is used in place of current-limited inverter circuit CELL 1, wherein the RC time-constant is utilized to determine the width of the pulse signal at output terminal OUTx.

The pulse signal produced at the output terminal OUTx may be utilized as the pulse signal (PLS) included in the bi-directional charge driver circuit shown in FIG. 2. Accordingly, the pulse width of the pulse signal (PLS) is selectable according to adjustments that made to pulse generator circuit (400). By adjusting the pulse width of the pulse signal (PLS) the charge and discharge time of capacitance circuit C1 shown in FIG. 2 is also adjustable.

It is appreciated that if the bi-directional charge driver circuit (200) shown in FIG. 2 and the pulse generator circuit (400) are on the same die, the capacitance circuits Cx and C1 will be the same type, and any current sources (e.g., I1, I2) are also the same type for both circuits (200, 400). Accordingly, process variations affecting the bi-directional charge driver circuit (200) also affect the pulse generator circuit (400) substantially the same. In one embodiment, the capacitance circuits Cx and C1 are poly-poly capacitors.

Figure 5:
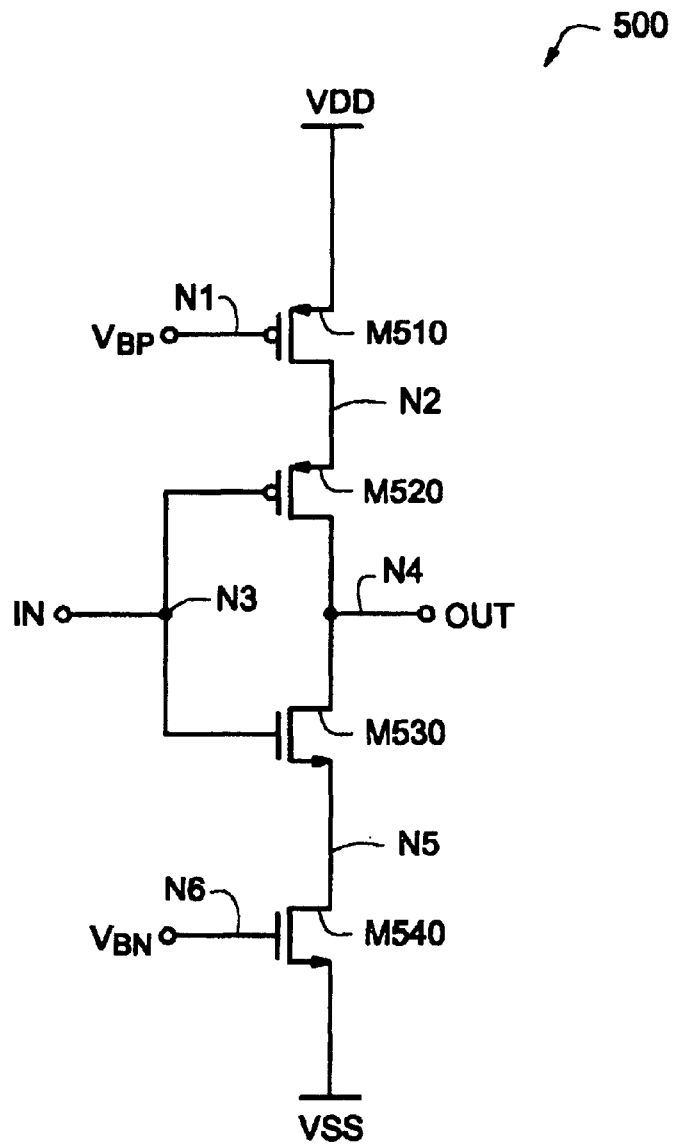
FIG. 5 shows an exemplary embodiment of the current-limited inverter circuits shown in FIG. 4, in accordance with the present invention.

FIG. 5 shows an exemplary embodiment of the current-limited inverters (CELL1, CELL2) shown in FIG. 3. The exemplary current-limited inverter (500) includes four MOS transistors (M510, M520, M530, M540).

MOS transistor M510 includes a source that is coupled to an upper voltage supply (VDD), a gate that is coupled to node N1, and a drain that is coupled to node N2. MOS transistor M520 includes a source that is coupled to node N2, a gate that is coupled to node N3, and a drain that is coupled to node N4. MOS transistor M530 includes a source that is coupled to node N5, a gate that is coupled to node N3, and a drain that is coupled to node N4. MOS transistor M540 includes a source that is coupled to a lower voltage supply (VSS), a gate that is coupled to node N6, and a drain that is coupled to node N5.

In operation, MOS transistor M510 is biased by bias signal VBP. MOS transistor M520 is active when the input signal at input terminal IN is a low logic level. MOS transistor M530 is active when the input signal at input terminal IN is a high logic level. MOS transistor M540 is biased by bias signal VBN. MOS transistor M510 and MOS transistor M520 operate to increase the potential at output terminal OUT when both MOS transistors (M510, M520) are active. MOS transistor M530 and M540 operate to decrease the potential at output terminal OUT when both MOS transistors (M530, M540) are active. Accordingly, the exemplary current-limited inverter (500) is an inverter with limited sink and source current. These current limits are set by the bias signals (VBP, VBN) and the sizes associated with MOS transistors M510 and M540. With a capacitive load, the current-limited inverter (500) will have relatively slow rising and falling edges at output terminal OUT. Accordingly, the slope of the transitions (i.e., high logic level to low logic level, low logic level to high logic level) at output terminal OUT are adjustable according to bias signals VBN and VBP. In addition, when the input is driven by a signal with a slow slew rate, the current-limited inverter (500) has a small quiescent current when MOS transistors M510, M520, M530, and M540 conduct. In one embodiment, the slope of the transitions at output terminal OUT is dynamically adjustable according to the application of the exemplary current-limited inverter (500). In another embodiment, the slope of the transitions introduced at output terminal OUT is set during manufacture by establishing a predetermined level for bias signals VBP and VBN, and a predetermined sizes associated with MOS transistors M510 and M540.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, comprising:
    a first switch circuit that is actuated in response to a first control signal;
    a second switch circuit that is actuated in response to a second control signal;
    a first transistor that is arranged to conduct a first current when the first switch circuit is in an open position;
    a second transistor that is arranged to conduct a second current when the second switch circuit is in an open position;
    a capacitance circuit that is arranged to be charged in response to the first current, and to be discharged in response to the second current, wherein the capacitance circuit is arranged to provide an output voltage that corresponds to a charge stored therein, wherein the output voltage is held substantially constant when the first and second switch circuits are in a closed position, the output voltage increases when the first switch circuit is in an open position and the second switch circuit is in a closed position, and the output voltage decreases when the first switch circuit is in a closed position and the second switch circuit is in an open position; and
    a reset circuit that is arranged to adjust the output voltage at power up.

2. The apparatus of claim 1, further comprising:
    a first diode circuit that is arranged to conduct a third current when the first switch circuit is in an open position; and
    a second diode circuit that is arranged to conduct a fourth current when the second switch circuit is in an open position.

3. The apparatus of claim 2, wherein the first transistor is arranged to mirror the third current conducted through the first diode circuit such that the first current is associated with the third current, and the second transistor is arranged to mirror the fourth current conducted through the second diode circuit, such that the second current is associated with the fourth current.

4. The apparatus of claim 1, wherein the reset circuit is coupled in parallel to the capacitance circuit and is configured to adjust the charge stored on the capacitance circuit to a predetermined voltage level at power-up.

5. The apparatus of claim 1, further comprising a logic circuit that is arranged to generate the first control signal and the second control signal.

6. The apparatus of claim 1, further comprising a buffer circuit coupled at a node corresponding to the capacitance circuit, such that the output of the buffer circuit is a reference voltage that corresponds to the output voltage.

7. The apparatus of claim 1, further comprising a logic circuit that is arranged to provide the first and second control signals in response to a pulse signal and a select signal, wherein the first and second transistors are deactivated when the pulse signal is a first logic level, wherein the first transistor is activated when the select signal is a second logic level and the pulse signal is a first inverse logic level, and wherein the second transistor is activated when the select signal is a second inverse logic level and the pulse signal is the first inverse logic level.

8. The apparatus of claim 7, wherein the pulse signal is generated by a pulse generator circuit that is arranged such that the width of the pulse for the pulse signal is adjustable.

9. A method of bi-directionally driving an output voltage, comprising:
    charging a capacitance circuit in response to a first current conducted through a first transistor, wherein the first transistor is activated when a first switch circuit is in an open position in response to a first control signal;
    discharging the capacitance circuit in response to a second current conducted through a second transistor, wherein the second transistor is activated when a second switch circuit is in an open position in response to a second control signal;
    holding the charge stored on the capacitance circuit substantially constant, wherein the first transistor and second transistor are deactivated when both the first switch circuit and the second switch circuit are in a closed position in response to the first and second control signals; and
    resetting the output voltage at power up using a reset circuit.

10. The method of claim 9, wherein the charge stored on the capacitance circuit corresponds to the output voltage.

11. The method of claim 9, wherein the method further comprises:
    conducting a third current through a first diode circuit when first switch circuit is in an open position; and
    transmitting a fourth current through a second diode circuit when the second switch circuit is in an open position.

12. The method of claim 11, wherein the method further comprises:
    mirroring the third current through the first transistor such that the first current is associated with the third current; and
    mirroring the fourth current through the second transistor such that the second current is associated with the fourth current.

13. The method of claim 9, wherein the method further comprises generating the first and second digital signals in response to a pulse signal and a select signal, wherein the first and second transistors are deactivated when the pulse signal is a first logic level, wherein the first transistor is activated when the select signal is a second logic level and the pulse signal is a first inverse logic level, and wherein the second transistor is activated when the select signal is a second inverse logic level and the pulse signal is the first inverse logic level.

14. The method of claim 13, wherein the method further comprises generating the pulse signal from a pulse generator circuit that is arranged such that a pulse width associated with the pulse signal is adjustable.

15. The method of claim 13, wherein the method further comprises:
    processing the pulse signal and the select signal using a NOR circuit to produce the first control signal; and
    processing the select signal and the inverse of the pulse signal using a NAND circuit to produce to the second control signal.

16. The method of claim 9, wherein the method further comprises buffering a reference voltage corresponding to the charge stored in the capacitance circuit to produce the output voltage.

17. An apparatus for a digital-to-analog converter, comprising:
    a first switch circuit that is actuated in response to a first digital signal;

a second switch circuit that is actuated in response to a second digital signal;

a first transistor that is arranged to conduct a first current when the first switch circuit is in an open position;

a second transistor that is arranged to conduct a second current when the second switch circuit is in an open position;

a capacitance circuit that is arranged to be charged in response to the first current, and to be discharged in response to the second current, wherein the capacitance circuit is arranged to provide an output voltage that corresponds to a charge stored therein;

a logic circuit that is arranged to provide the first and second digital signals in response to a pulse signal and a select signal, wherein the first and second transistors are deactivated when the pulse signal is a first logic level, wherein the first transistor is activated when the select signal is a second logic level and the pulse signal is a first inverse logic level, and wherein the second transistor is activated when the select signal is a second inverse logic level and the pulse signal is the first inverse logic level, such that the output voltage increases by a first amount that is determined by the first current and a pulse width associated with the pulse signal, and the output voltage decreases by a second amount that is determined by the second current and the pulse width associated with the pulse signal; and a reset circuit that is arranged to adjust the charge stored in the capacitance circuit at power up.

18. An apparatus as in claim 17, further comprising a pulse generator circuit that is arranged to provide the pulse signal, wherein the pulse width of the pulse signal is adjustable by the pulse generator circuit.

19. The apparatus of claim 18, wherein the pulse generator circuit includes a capacitor that includes substantially the same properties as the capacitance circuit.

* * * * *

UNITED STATES PATENT AND TRADEMARK OFFICE
CERTIFICATE OF CORRECTION

PATENT NO.    : 6,750,685 B1
DATED         : June 15, 2004
INVENTOR(S)   : Francisco Javier Guerrero Mercado It is certified that error appears in the above-identified patent and that said Letters Patent is hereby corrected as shown below:

Column 5,
Line 6, "an a capacitance" should read -- a capacitance --
Line 6, "(C1). and buffer" should read -- (C1), and buffer --.

Column 10,
Line 58, "produce to the second control signal" should read -- produce the second control signal --.

Signed and Sealed this

Seventh Day of December, 2004

JON W. DUDAS
*Director of the United States Patent and Trademark Office*